US 6,557,419 B1

(12) United States Patent
Herb et al.

(10) Patent No.: US 6,557,419 B1
(45) Date of Patent: May 6, 2003

(54) ZERO TCF THIN FILM RESONATOR

(75) Inventors: William R. Herb, Minneapolis, MN (US); David W. Burns, Minneapolis, MN (US); Daniel W. Youngner, Maple Grove, MN (US)

(73) Assignee: Honeywell International Inc., Morristown, NJ (US)

( * ) Notice: Subject to any disclaimer, the term of this patent is extended or adjusted under 35 U.S.C. 154(b) by 0 days.

(21) Appl. No.: 08/777,652

(22) Filed: Dec. 31, 1996

(51) Int. Cl.7 .................................................. G01B 7/16
(52) U.S. Cl. ........................................................ 73/766
(58) Field of Search ............................ 73/708, 766, 778, 73/862.41, 862.59, 702, 704, 514.29, 324, 862.623, 862.632, 862.634, 862.637, 514.21–514.24, 514.36

(56) References Cited

U.S. PATENT DOCUMENTS

| 5,511,427 A | * | 4/1996 | Burns | 73/708 |
| 5,656,846 A | * | 8/1997 | Yamada | 73/514.29 |
| 5,677,485 A | * | 10/1997 | Nakamura | 73/514.29 |
| 5,707,746 A | * | 1/1998 | Yaoi et al. | 428/448 |
| 5,914,507 A | * | 6/1999 | Polla et al. | 73/514.36 |
| 5,936,159 A | * | 8/1999 | Kano et al. | 73/514.36 |
| 6,188,838 B1 | * | 2/2001 | Mikata et al. | 392/418 |

FOREIGN PATENT DOCUMENTS

| JP | 406160207 | * | 6/1994 | 73/862.639 |
| SU | 0746218 | * | 7/1980 | 73/708 |

* cited by examiner

*Primary Examiner*—Robert Raevis

(57) ABSTRACT

A multi-material resonant thin film beam for a micromechanical sensor having a zero temperature coefficient of frequency (TCF) which is the resonant frequency shift with temperature change. One of the materials may be polysilicon and the other material may be silicon nitride or silicon oxide. Each material has a different thermal coefficient of expansion. The proportion of the various materials is adjusted and the specific geometries are determined so that the TCF is zero. One embodiment is a microbeam composed of two polysilicon thin films with a silicon nitride thin film inserted between the polysilicon films. The thickness of the silicon nitride film may be adjusted to trim the TCF to zero. The film of nitride instead may be placed on one side of a polysilicon film to form a beam. Dual or multiple beam resonators likewise may be made with several materials. The nitride may be placed in the shank areas which join and secure the ends of the beams. Such zero TCF beams may be incorporated in microsensor structures for measuring pressure, temperature, strain and other parameters.

4 Claims, 4 Drawing Sheets

ZERO TCF THIN FILM RESONATOR

BACKGROUND OF THE INVENTION

The invention pertains to sensors and particularly to resonant sensors. More particularly, the invention pertains to micromechanical sensors having a composite or multi-material resonant microbeam having a frequency that is temperature invariant or, in other terms, has a zero temperature coefficient of frequency (TCF).

Related art micromechanical sensors use resonators fabricated from a single material such as quartz, single crystal silicon or deposited polysilicon films. The resonators of each of these approaches are subject to variations in frequency with temperature due to changes in density, elastic moduli and other parameters. The present invention reduces these variations with a multi-material resonator that has a frequency-to-temperature sensitivity of nearly zero which is comparable with very high precision resonators such as those of well-cut quartz.

SUMMARY OF THE INVENTION

The present invention involves a composite resonant microstructure, supported firmly at each end, utilizing a second, dissimilar material so that the shift in frequency with device temperature can be tailored. The specific geometries for this resonator is such that the shift in the resonant frequency with temperature is virtually zero. The composite resonator is made of at least two deposited thin films. One of the films is polysilicon, and the second is from a group including silicon nitride and silicon oxide. The composite thin film resonator may have the second material film centrally located so as to minimize bending stresses on the second material. The second material film may traverse some, but not all, of the length and width of the resonator. The composite thin film resonator has the second film material at a prescribed thickness, and the area of the second material film is adjusted to tailor the temperature sensitivity of the resonator.

The composite thin film resonator may be designed to operate in a balanced mode, where the second material film traverses an area where vibrations are minimal in that the temperature sensitivity of the resonator is tailorable and can be made practically non-existent.

A micromechanical sensor incorporating one or more resonators, with integral vacuum cavities over the resonators, such that the shift in frequency with temperature can also be tailored so as to be zero.

A sensor containing two or more resonators of differing lengths, for separating the frequencies of the individual resonators, wherein the lengths or widths of the second material film are not identical, can still allow the temperature sensitivity of the individual resonators to be tailored and set to zero. Such sensor may be a pressure sensor or an accelerometer containing one or more resonators having a temperature coefficient of frequency that can be reduced to zero. A strain sensor may likewise contain one or more resonators such that the temperature coefficient of frequency can be trimmed and set to zero.

DESCRIPTION OF THE PREFERRED EMBODIMENTS

Figure 1:
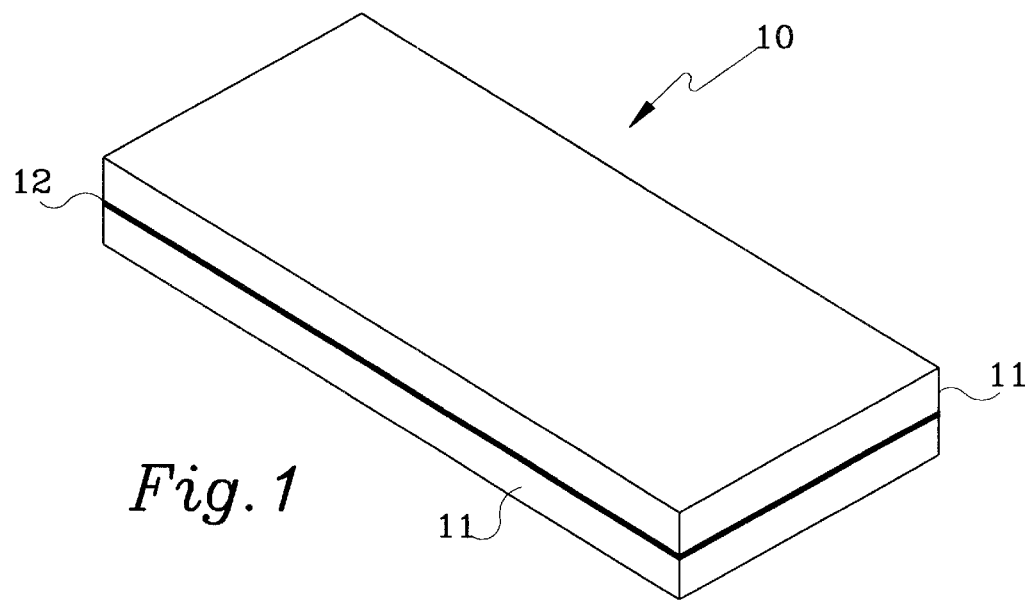
FIG. 1 reveals a multi-material microbeam for a micromachined resonant beam sensor.
Figure 2:
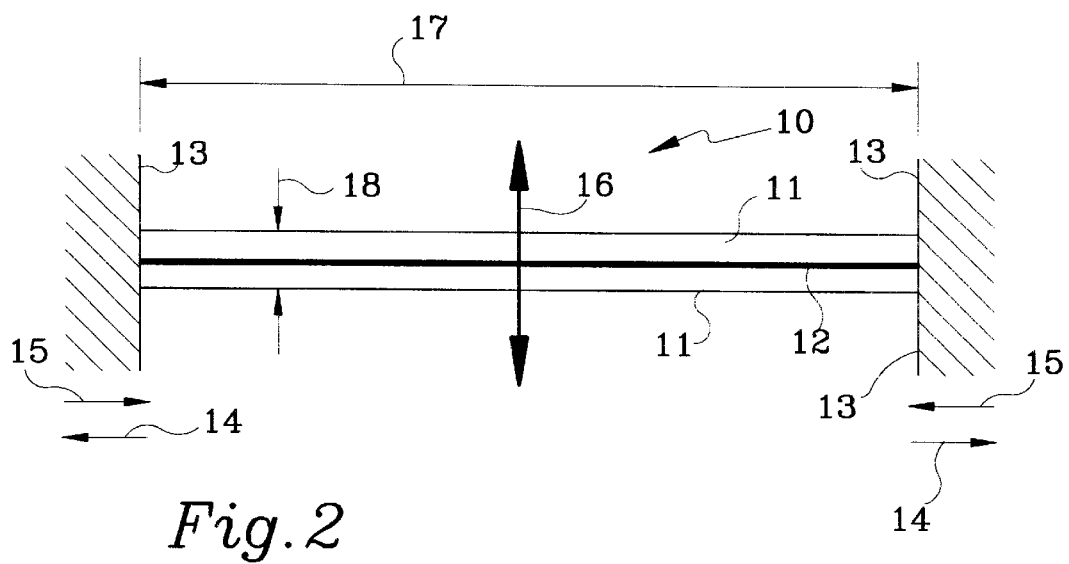
FIG. 2 shows a cross-section of the resonant beam and its supporting structure.

FIG. 1 shows a thin film resonator 10, formed by consecutive depositions of material 11 (e.g., polysilicon) and material 12 (e.g., silicon nitride or silicon oxide), which has an effective thermal expansion coefficient which is a composite of two individual materials 11 and 12. A standard resonator (composed of one material 11) exhibits small shifts in frequency with temperature due to slight shifts in density, elastic moduli and length. The addition of a second material 12, buried inside or affixed to microresonator 10, can be used to alter the effective axial stress in composite resonator 10 due to temperature changes which is much like the adjusting the tension of a guitar string. The thermal coefficient of expansion for polysilicon is nominally 2.5 parts per million (ppm) per degree Celsius (C.) of temperature, and for silicon nitride it is 1.5 ppm per degree C. By careful selection of the film thicknesses, the composite thermal expansion coefficient can be varied, and a near-zero frequency shift with temperature change can be obtained. A composite microbeam 10, shown in FIG. 1, has additional material 12 centrally located to minimize the bending stresses in material 12. Microbeam 10 is typically doubly supported at points 13, as shown in FIG. 2, to achieve large frequency shifts relative to applied axial strains for pressure, acceleration and strain measurements having good dynamic range. Micromechanical sensors for measuring pressure, acceleration and strain have been demonstrated using thin-film resonant microbeams coupled with an appropriate silicon microstructure. The output of such sensors is a quasi-digital frequency signal corresponding to the applied stimulus. A resonant microbeam pressure sensor, for example, has one or more resonant microbeams 10 fabricated on a silicon diaphragm, where pressure differentials across the diaphragm create in-plane bending stresses which pull 14 (or push 15) ends 13 of resonator 10 causing shifts in the resonant frequency of vibration 16 of microbeam 10. The output frequencies can be subtracted from one another, resulting in first-order cancellation of second order effects such as shifts with temperature. These sensors can benefit, however, from the ability to reduce the innate temperature sensitivity of resonant microbeam 10 to zero or near zero, particularly for very high precision applications. High precision sensors made from alpha-cut quartz, for example, have a nearly zero temperature coefficient of expansion and are therefore much less sensitive to temperature effects. Extensive algorithms can be developed for modeling out the temperature effects of a resonant microbeam 10 sensor, though these algorithms can be minimized appreciably by reducing or eliminating the temperature sensitivity. Medium-performance sensors with no temperature correction ability would be improved if the innate temperature sensitivity were reduced. High-performance sensors would be further improved by low or zero TCF microbeams 10 by reducing the accuracy needed for the local temperature measurement used for temperature compensation.

Figure 4:
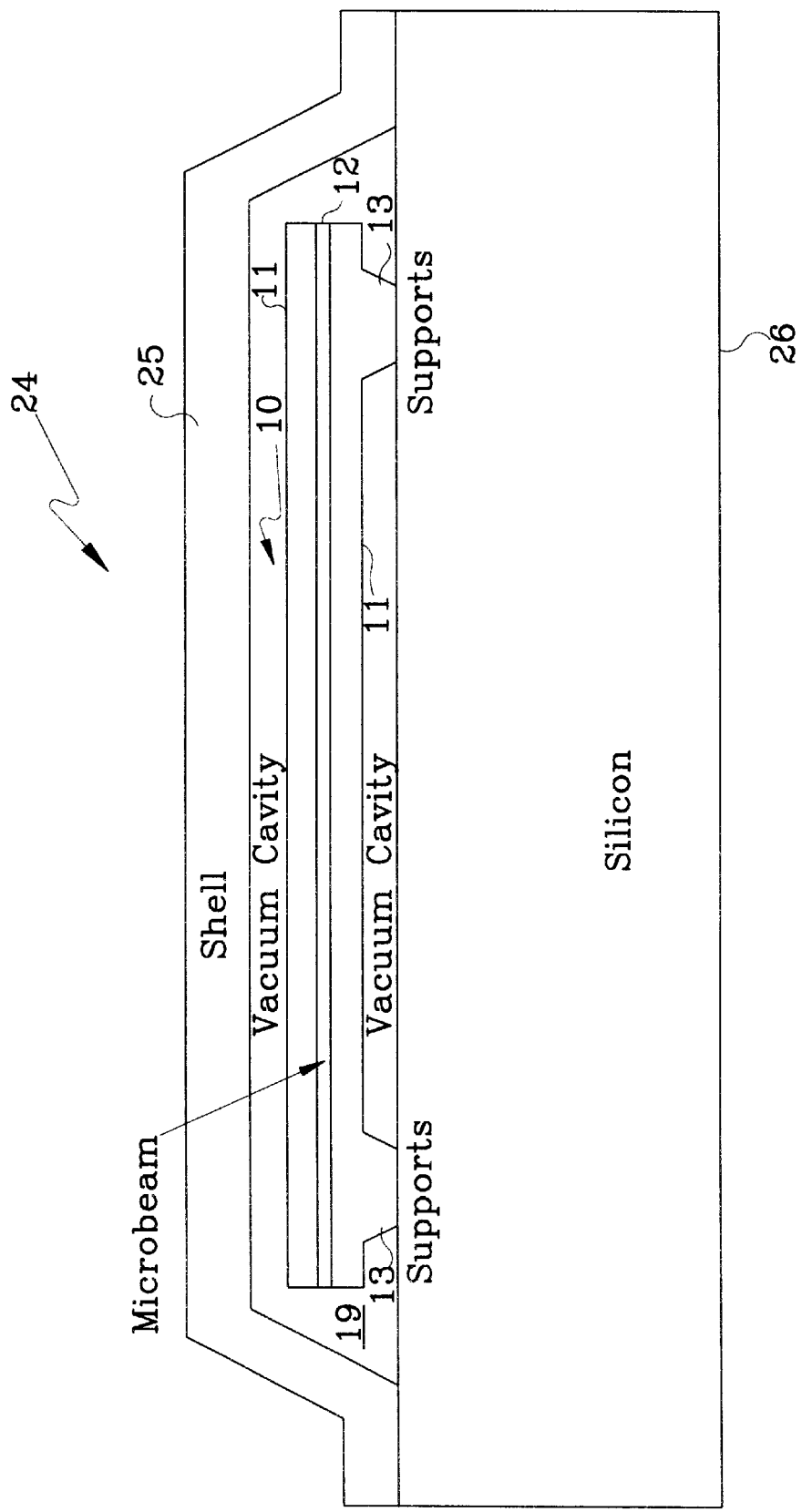
FIG. 4 shows a multi-material resonant beam in a micromechanical sensor.

Previously developed micromechanical sensors use resonators fabricated from a single material such as quartz, single crystal silicon or deposited polysilicon films. Several of these sensors are disclosed in U.S. Pat. No. 4,744,863 issued May 17, 1988, by inventors Henry Guckel et al., and entitled "Sealed cavity Semiconductor Pressure Transducers and Method of Producing the Same," U.S. Pat. No. 5,417,115 issued on May 23, 1995, by inventor David W. Burns, and entitled "Dielectrically Isolated Resonant Microsensors," U.S. Pat. No. 5,458,000 issued on Oct. 17, 1995, by inventors David W. Burns et al., and entitled "Static Pressure Compensation of Resonant Integrated Microbeam Sensors," and U.S. Pat. No. 5,511,427 issued Apr. 30, 1996, by inventor David W. Burns, and entitled "Cantilevered Microbeam Temperature Sensor," which are hereby incorporated by reference in this present description. The resonators of this and other related art have various excitation mechanisms, including a piezoelectric drive, optical drive, electrostatic drive and magnetic drive. Sense mechanisms include a piezoelectric sense, piezoresistive sense, capacitive sense, optical sense, magnetic sense and FET sense. The resonators of these approaches are subject to variations in frequency with temperature due to changes in density, elastic moduli, Poisson's ratio, internal strain and incremental length. The polysilicon resonators have integral vacuum cavities and may utilize additional passivation layers of various materials in the sensor construction. The temperature effects of these additional layers and materials, as well as any package-induced thermal stress, can be nulled by further alterations of the medial nitride layer thickness in resonator microbeam 10. Polysilicon resonators inherently have a very low temperature sensitivity of about −40 ppm per degree C., resulting mainly from slight density changes and small elastic moduli changes with temperature. The invention disclosed here, however, adds a feature for reducing this temperature sensitivity to less than 2 ppm/degree C., which is comparable to that of well-cut quartz and designable to account for thermal stresses related to passivation layers, microstructure configuration and packaging of the sensor. FIG. 4 shows a polysilicon resonator 24 incorporating the present silicon nitride medial layer 12 in beam 10 which is shown inside an integral vacuum cavity 19. Cavity 19 is formed with a polysilicon cover or shell 25 formed on a silicon substrate 26.

Figure 3:
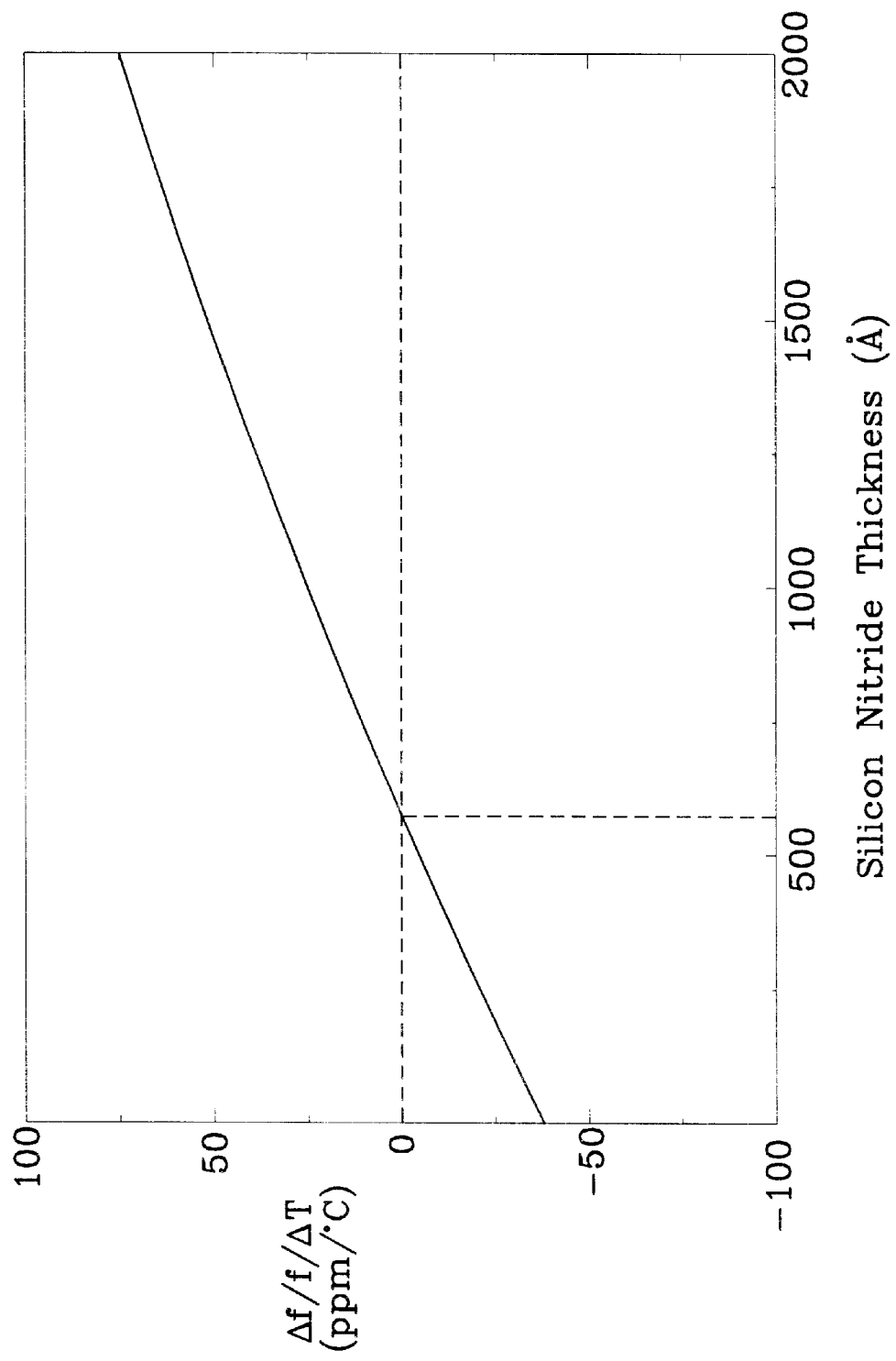
FIG. 3 is a graph of the change of frequency relative to the resonant frequency per degree of temperature relative to the thickness of the second material layer in the composition of a resonant beam.

The normalized frequency shift with temperature or the variation in frequency-to-temperature sensitivity versus silicon nitride thickness, for a two micron thick and 200 micron long polysilicon resonator beam 10 is illustrated in FIG. 3. FIG. 3 is a graph of the change of frequency relative to the resonant frequency (Δf/f) in ppm per degree C. relative to the thickness in angstroms of the second material layer 12 (i.e., silicon nitride) in the composition of resonant beam 10. The ideal thickness noted in the graph is about 570 Angstroms for a silicon nitride layer 12 buried between two polysilicon layers so as to result in a zero TCF for resonator microbeam 10. The nitride may be formed as a layer at the center (i.e., neutral axis) of microbeam 10 to minimize the effects of cyclic stressing, though a zero TCF can also be obtained by depositing film 12 on the surface of resonator beam 10.

The zero TCF (which is equal to $(1/f)*(\partial f/\partial T)$) microbeam 10 described here utilizes a second thin film 12, buried within resonator 10, to cancel the effects of temperature on the resonant frequency. It achieves this not by canceling the thermal expansion coefficient of first film 11, but rather indirectly by changing the effective axial stress on microbeam 10. It is well recognized that large shifts in the resonant frequency of microbeam 10 occur when ends 13 of microbeam 10 are stretched or compressed, and are related to the square of the ratio of length 17 to thickness 18. It is also recognized that a major factor in the fundamental frequency, besides geometrical and physical properties, is the residual or internal strain in microbeam 10. The internal strain can be compressive or tensile, and significant amounts of compressive strain 15 can even buckle microbeam 10 and push the resonant frequency to zero. The incorporation of a second material film 12, of prescribed thickness, length, width and geometry dependent on the resonator dimensions, can be used to cancel the effects of shifts in the density or Young's modulus with temperature by changing the effective internal strain in microbeam 10.

The concept can be described by reviewing the equation below, relating the resonant frequency f(T) of beam 10 to length 17 (L), thickness 18 (h), Young's modulus (E), density ($\rho$), internal strain ($\epsilon_0$) and numerical constants. The square root of Young's modulus divided by the density accounts for about a −40 ppm/degree C. shift in the resonant frequency with temperature for a polysilicon microbeam. The internal strain can be used to make the resonator temperature insensitive by the addition of a second film 12 in the construction of resonator beam 10. This term can be set to cancel the shift in the physical constants, resulting in a zero TCF resonator 10.

$$f(T) = C_1 \sqrt{\frac{E(T)}{\rho(T)}} \frac{h}{L^2} \sqrt{1 + C_2 \varepsilon(T)\left(\frac{L}{h}\right)^2} \quad (1)$$

where $$\sqrt{\frac{E(T)}{\rho(T)}}$$

represents the −40 ppm/degree C. shift in resonant frequency.

Inspection of the equation (1) shows a strong dependency of temperature effect of the resonator frequency on resonator 10 length 17. In configurations where more than one microbeam 10 is utilized, such as in the push-pull resonant microbeam pressure sensor or accelerometer, where separation in the resonant frequencies is desired to minimize electrical or mechanical coupling, a single thickness medial layer 12 can still be used, simply by reducing the length or lessening the width of the medial layer and not spanning the full distance 17 of resonator 10. Similarly, in optical resonator designs where it is desired to specify the medial layer 12 thickness (i.e., to minimize reflections by forming a quarter-wave plate), the TCF can be obtained by reducing the area of medial layer 12.

Figure 5A:
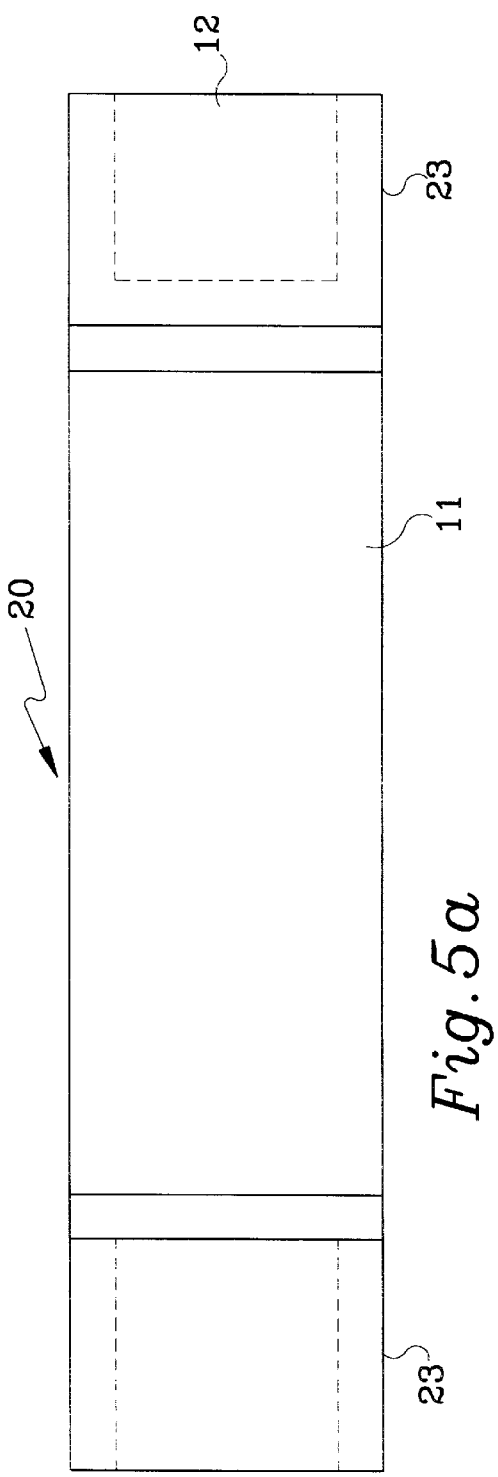
FIGS. 5a and 5b illustrate a microbeam resonator capable of operating in a balanced mode with incorporation of a second material in the end regions.
Figure 5B:
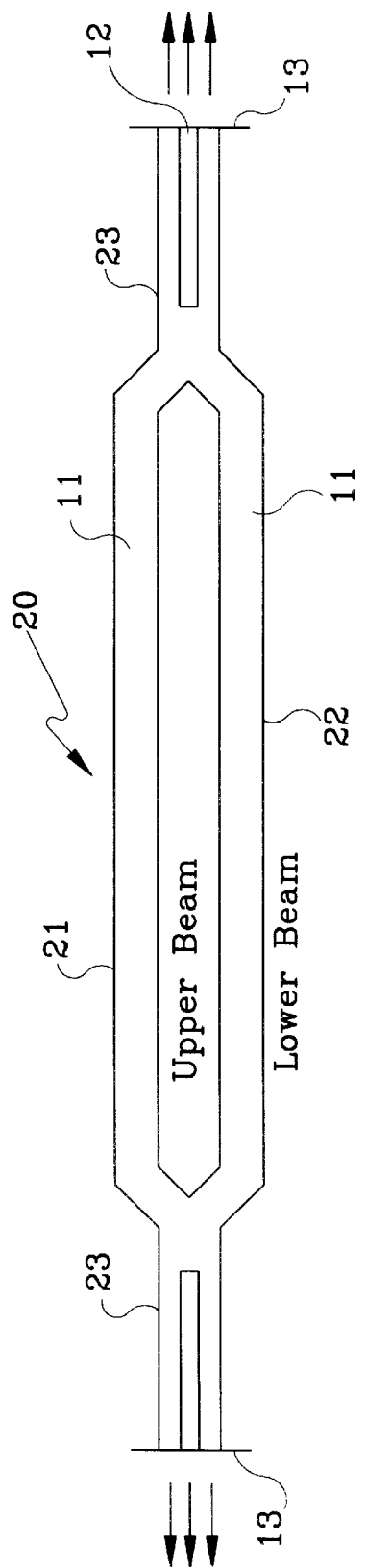

Resonators operating in a balanced mode, where all end moments and forces are zero, are used to minimize the detrimental effect of mechanical coupling between adjacent microbeams 10. Such a resonator 20 is shown in FIGS. 5a and 5b. Similar in many ways to a dual end-to-end tuning fork, resonator 20 operates in a balanced mode with the upper beam 21 and lower beam 22 vibrating 180 degrees out of phase with each other, i.e., upper beam 21 moves up while lower beam 22 moves down and vice versa, thereby canceling the moments and resulting forces at ends 13 of the microbeams. A shank region 23, where the two microbeams 21 and 22 are joined, contain a tailored nitride geometry such that zero TCF can be reached. Shank region 23 is where very little or no vibration of microbeam 21 or 22 occurs. Other configurations of biplane microbeam 20 with variants on the support conditions can also incorporate the zero TCF invention. Various geometric and composition configurations of several materials in single or multiple resonant beam structures may be made to achieve a zero TCF for the micromechanical resonant sensor assembly. A single or multiple resonant beam structure may be made to achieve a zero TCF for the micromechanical resonant sensor assembly.

What is claimed is:

1. A thin film microbeam comprising:
    a first film composed of a first material having a first thermal coefficient of expansion; and
    a second film composed of a second material having a second and different thermal coefficient of expansion, formed on said first film;
    the relative dimensions of the first and second films are such that a resonant frequency of said microbeam is effectively temperature invariant.

2. The thin film microbeam of claim 1 wherein said microbeam has at least one end secured to a place so that said microbeam can vibrate at a resonant frequency relative to the place.

3. The thin film microbeam of claim 2 wherein:
    the first material is polysilicon; and
    the second material is selected from the group consisting of silicon nitride and silicon oxide.

4. A thin film microbeam comprising:
    a first thin film having a first material having a first thermal coefficient of expansion;
    a second thin film having a second material having a second, different thermal coefficient of expansion, formed on said first thin film: and
    a third thin film having the first material formed on said second thin film;
    the geometries and dimensions of the first, second and third films are such that the combination of the thin films having different coefficients of expansion result in the microbeam having a composite thermal coefficient of expansion such that the beam has a resonant frequency that does not vary with a change in temperature of the microbeam.

* * * * *